(12) United States Patent
Lian et al.

(10) Patent No.: US 8,981,985 B2
(45) Date of Patent: Mar. 17, 2015

(54) ANALOG-TO-DIGITAL CONVERTER FOR A MULTI-CHANNEL SIGNAL ACQUISITION SYSTEM

(75) Inventors: Yong Lian, Singapore (SG); Wen-sin Liew, Singapore (SG); Xiaodan Zou, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 14/342,918

(22) PCT Filed: Sep. 6, 2012

(86) PCT No.: PCT/SG2012/000324
§ 371 (c)(1),
(2), (4) Date: Mar. 5, 2014

(87) PCT Pub. No.: WO2013/036204
PCT Pub. Date: Mar. 14, 2013

(65) Prior Publication Data
US 2014/0232582 A1    Aug. 21, 2014

Related U.S. Application Data

(60) Provisional application No. 61/531,170, filed on Sep. 6, 2011.

(51) Int. Cl.
H03M 1/12    (2006.01)
H03M 1/34    (2006.01)
H03M 1/14    (2006.01)
H03M 1/46    (2006.01)

(52) U.S. Cl.
CPC .............. *H03M 1/34* (2013.01); *H03M 1/1225* (2013.01); *H03M 1/14* (2013.01); *H03M 1/46* (2013.01)

USPC .......................................... 341/155; 341/156

(58) Field of Classification Search
USPC .................... 341/158, 155, 122, 161, 156
See application file for complete search history.

(56) References Cited

U.S. PATENT DOCUMENTS

| | | | | |
|---|---|---|---|---|
| 4,940,981 A * | 7/1990 | Naylor et al. | ................. | 341/161 |
| 4,973,975 A * | 11/1990 | Yamazaki et al. | ............ | 341/122 |
| 6,809,674 B1 * | 10/2004 | Ramsden | ....................... | 341/155 |
| 6,958,722 B1 * | 10/2005 | Janakiraman et al. | ........ | 341/161 |
| 7,053,810 B2 * | 5/2006 | Harada et al. | ................. | 341/163 |
| 8,248,283 B2 * | 8/2012 | Mandal et al. | ................ | 341/141 |

* cited by examiner

*Primary Examiner* — Brian Young
(74) *Attorney, Agent, or Firm* — Nath, Goldberg & Meyer; Jerald L. Meyer (57) ABSTRACT

An analog-to-digital converter (ADC) for a multi-channel signal acquisition system, a signal acquisition system, a method of generating a digital output code from an analog input signal, and a method of converting a plurality of analog signals to a digital signal are provided. The ADC comprises a sample-and-hold (S/H) circuit operable to receive an analog input signal for each input channel; a digital-to-analog converter (DAC) common to all input channels; a comparator for each input channel configured to receive an output signal from the S/H circuit of the respective input channel, and an output signal from the DAC, for generating a comparison result of the two signals at each conversion cycle of the comparator; and a successive approximation register (SAR) common to all input channels and configured to generate, for each input channel, a digital output code based on the comparison results received from the respective comparator.

20 Claims, 11 Drawing Sheets

ANALOG-TO-DIGITAL CONVERTER FOR A MULTI-CHANNEL SIGNAL ACQUISITION SYSTEM

This is a National Phase Application filed under 35 U.S.C. 371 as a national stage of PCT/SG2012/000324, filed Sep. 6, 2012, and claims priority benefit from U.S. Application No. 61/531,170, filed Sep. 6, 2011, the content of each of which is hereby incorporated by reference in its entirety.

FIELD OF INVENTION

The present invention relates broadly to an analog-to-digital converter (ADC) for a multi-channel signal acquisition system, to a signal acquisition system, to a method of generating a digital output code from an analog input signal received at an input channel of a plurality of input channels, and to a method of converting a plurality of analog input signals to a digital output signal.

BACKGROUND

Biomedical signal acquisition has gained much attention in recent years due to the fast growing market for portable biomedical electronics such as wearable or implantable health monitoring devices. Such devices typically include an analog front-end for signal amplification and conditioning, and an analog-to-digital converter (ADC) for quantization. Additionally, these devices often demand multi-channel operation to record biological signals from various sites.

A direct method of implementing a multi-channel signal acquisition system is to employ an independent analog front-end and ADC for each channel. However, this method is cost-inefficient as it requires multiple ADCs which require additional area to implement.

Figure 1:
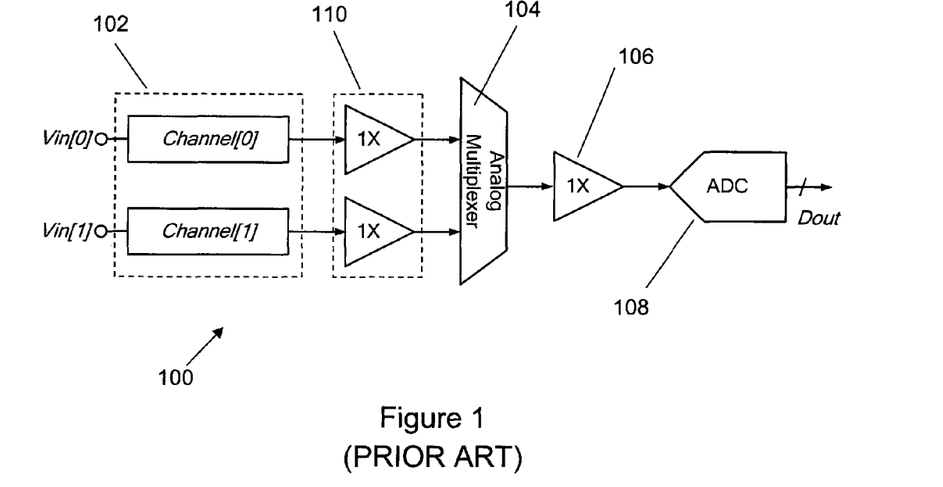
FIG. 1 shows block diagram illustrating a conventional multi-channel signal acquisition system.

Therefore, a multi-channel signal acquisition system is conventionally implemented by utilizing an analog multiplexer. FIG. 1 shows a typical conventional multi-channel signal acquisition system 100. In FIG. 1, only two channels are shown to illustrate the concept; however, it would be appreciated that an m number of channels can be used to form an m-channel signal acquisition system. The system 100 includes multiple analog front-ends 102 to acquire and amplify signals from different sites. By utilizing an analog multiplexer 104, the amplified signals are multiplexed to an ADC 108 for quantization. Quantization for each channel is performed one after another in a sequential order.

Although the conventional structure as shown in FIG. 1 can reduce the number of ADCs required in a multi-channel signal acquisition system, the ADC has a very limited time to sample an input signal during the sampling phase. As a result, the multiplexer 104 needs a preceding buffer 110 along with a following buffer 106, both with an exceedingly high bandwidth, as compared to the bandwidth of the input signal, to minimize quantization error due to sampling error. As a higher bandwidth requires a larger biasing current, a high bandwidth buffer is unfavorable in a system optimized for e.g. low power and high energy efficiency. For example, in one conventional approach, the power dissipation for the buffer can be more than 30 times the power of a low-noise preamplifier. Furthermore, incorporating an analog multiplexer in a multi-channel signal acquisition system is equivalent to inserting additional switches in the critical signal path and producing undesirable signal distortion, especially in a low-voltage operation with limited voltage headroom. Lastly, channel crosstalk is also a common issue in an analog multiplexing system.

Figure 2:
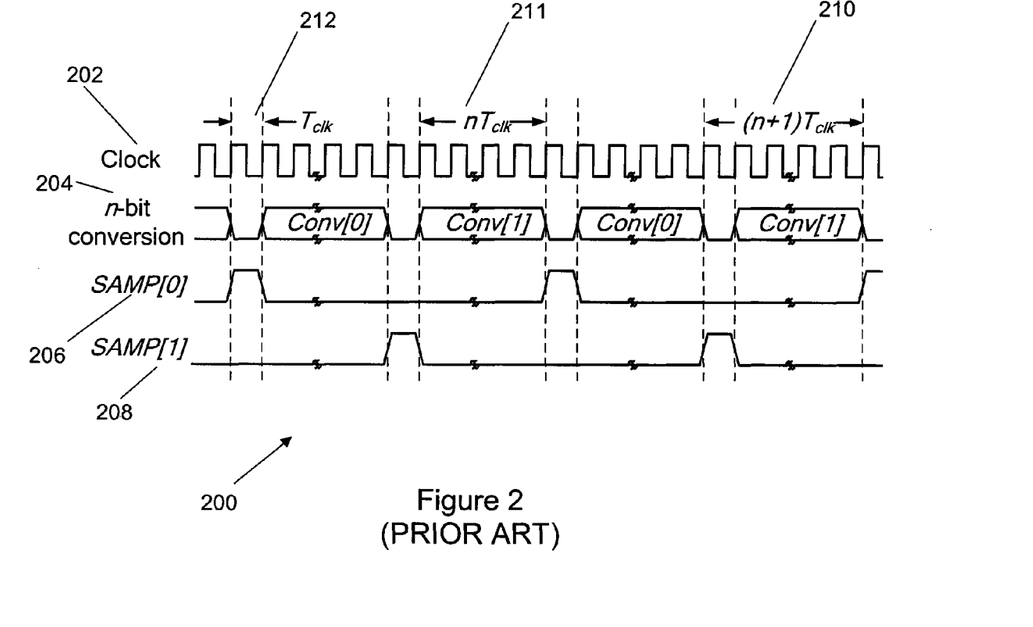
FIG. 2 shows the timing diagram of the conventional multi-channel signal acquisition system of FIG. 1.

FIG. 2 shows an ADC conversion timing diagram 200 for the multi-channel signal acquisition system 100 shown in FIG. 1. Assuming that a successive approximation (SA) ADC is used for quantization and the quantization is performed under an ADC clock 202, every channel requires at least n+1 clock cycles ($T_{clk}$) 210 for an n-bit quantization. In this case, an n-bit conversion 204 takes a period of $nT_{clk}$ 211 while a sampling phase for each channel 206, 208 is limited to a period of $T_{clk}$ 212. Because of such a short sampling time, the preceding buffer (e.g. 110 in FIG. 1) requires a very large bandwidth compared to the bandwidth of the target signal, as described above, as well as a high slew rate. This may lead to low system power efficiency. The bandwidth and slew rate requirements of the buffer may be reduced, but at the cost of a higher ADC conversion rate and a faster ADC clock, which may also lead low system power efficiency in return.

Therefore, a need exists to provide a multi-channel signal acquisition system that seeks to address at least some of the above problems.

SUMMARY

According to a first aspect of the present invention, there is provided an analog-to-digital converter (ADC) for a multi-channel signal acquisition system, the ADC comprising: a sample-and-hold (S/H) circuit for each input channel, and operable to receive a respective analog input signal for each input channel; a digital-to-analog converter (DAC) common to all input channels; a comparator for each input channel, said comparator configured to receive an output signal from the S/H circuit of the respective input channel as a first input signal, and an output signal from the DAC as a second input signal, for generating a comparison result at each conversion cycle of the comparator; and a successive approximation register (SAR) common to all input channels and configured to generate, for each input channel, a digital output code based on the comparison results received from the respective comparator.

According to a second aspect of the present invention, there is provided a signal acquisition system comprising: a plurality of input channels; an analog-to-digital converter (ADC) comprising: a sample-and-hold (S/H) circuit for each input channel, and operable to receive a respective analog input signal for each input channel; a digital-to-analog converter (DAC) common to all input channels; a comparator for each input channel, said comparator configured to receive an output signal from the S/H circuit of the respective input channel as a first input signal, and an output signal from the DAC as a second input signal, for generating a comparison result at each conversion cycle of the comparator; and a successive approximation register (SAR) common to all input channels and configured to generate a digital output signal; and a digital multiplexer (MUX) configured to receive the comparison results from the respective comparators as inputs and multiplex said comparison results prior to inputting to the SAR for generating the digital output signal.

According to a third aspect of the present invention, there is provided a method of generating a digital output code from an analog input signal received at an input channel of a plurality of input channels, the method comprising the steps of: receiving said analog input signal at a sample-and-hold (S/H) circuit and a comparator for said input channel; providing a digital-to-analog converter (DAC); comparing, at the comparator, a first input signal received from the S/H circuit of said input channel with a second input signal received from the DAC for generating a comparison result at each conversion cycle of the comparator; and generating, at a successive approximation register (SAR) common to all input channels, the digital output code based on the comparison results received from the comparator for said input channel.

According to a fourth aspect of the present invention, there is provided a method of converting a plurality of analog input signals to a digital output signal, the method comprising the step of: providing a plurality of input channels; receiving the respective analog input signal at a sample-and-hold (S/H) circuit and a comparator for each input channel; providing a digital-to-analog converter (DAC); comparing, at the comparator, a first input signal received from the S/H circuit of the respective input channel with a second input signal received from the DAC for generating a comparison result at each conversion cycle of the comparator; multiplexing, using a digital multiplexer (MUX), the comparison results received from the respective comparators; and generating, at a successive approximation register (SAR) common to all input channels, a digital output signal based on the multiplexed signal.

BRIEF DESCRIPTION OF THE DRAWINGS

Embodiments of the invention will be better understood and readily apparent to one of ordinary skill in the art from the following written description, by way of example only, and in conjunction with the drawings, in which:

FIG. 11b shows a graph of simulated on resistance versus input voltage for the switch of FIG. 11a.

DETAILED DESCRIPTION

Example embodiments of the present invention seek to provide a multiplexing scheme for a multi-channel signal acquisition system. Secondly, the example embodiments seek to provide a longer and/or variable sampling period, and to avoid the use of a high bandwidth and high slew rate buffer. Thirdly, the example embodiments seek to avoid the use of an analog multiplexer in the critical signal path and minimize channel crosstalk. As described in the example embodiments, these may be achieved through an analog-to-digital converter (ADC) with multiple input channels.

Some example embodiments of the present invention are described in detail below. Those skilled in the art, however, will realize that it exemplifies but is not limiting the scope of the invention. Without deviating from the main concept and spirit, many of the details described hereinafter can be readily modified and applied in conjunction with other techniques in the art to conform to different design requirements.

Figure 3A:
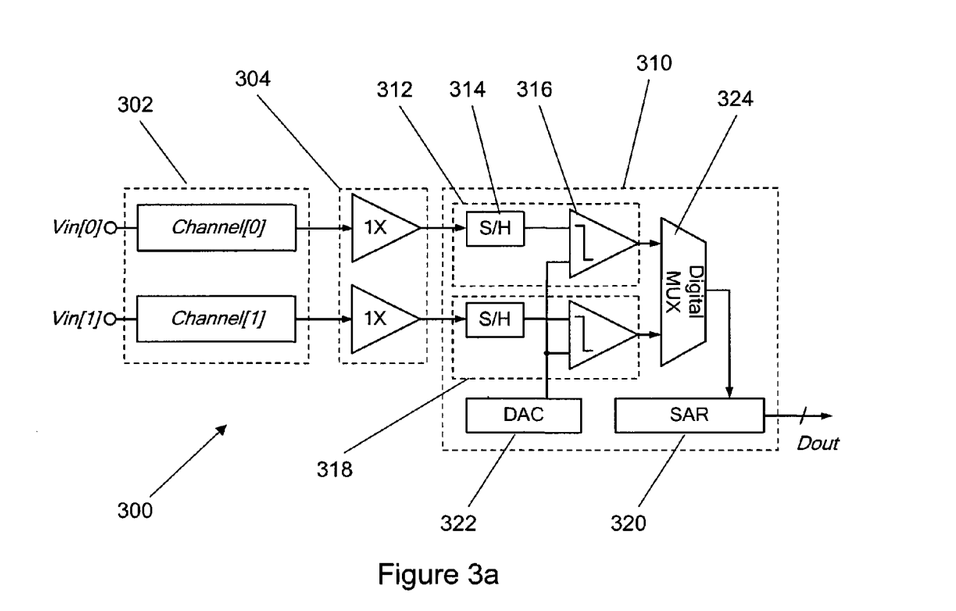
FIG. 3a shows a schematic circuit diagram of a multi-channel signal acquisition system according to an example embodiment.

FIG. 3a shows a block diagram illustrating a multi-channel signal acquisition system 300 according to an example embodiment. While only two channels are shown in FIG. 3a to illustrate the concept, it would be appreciated that an m-channel acquisition system can be formed by adding related components. The system 300 comprises multiple analog front-ends 302 and an ADC 310 with multiple inputs driven by buffers 304. The analog front-ends 302 provide amplification and filtering for respective signals acquired from multiple sites. The following buffers 304, with sufficient bandwidth and driving capability, drive the ADC inputs. The ADC 310 quantizes the input from each channel one after another in sequential order.

The ADC 310 has an independent input channel 312, 318, in the case of a two-channel configuration, for each input. Every input channel includes a sample and hold (S/H) stage (hereinafter also referred to as circuit) 314 and a comparator 316. The S/H stage 314 samples the input during a sampling phase and holds the sampled input during the quantization. A comparator 316 performs signal comparison and produces a comparison result which is then multiplexed by a digital multiplexer (MUX) 324 to a successive approximation register (SAR) 320. The digital-to-analog converter (DAC) 322, which produces a comparison input for the comparator 316, is shared among all input channels 312, 318.

Figure 4A:
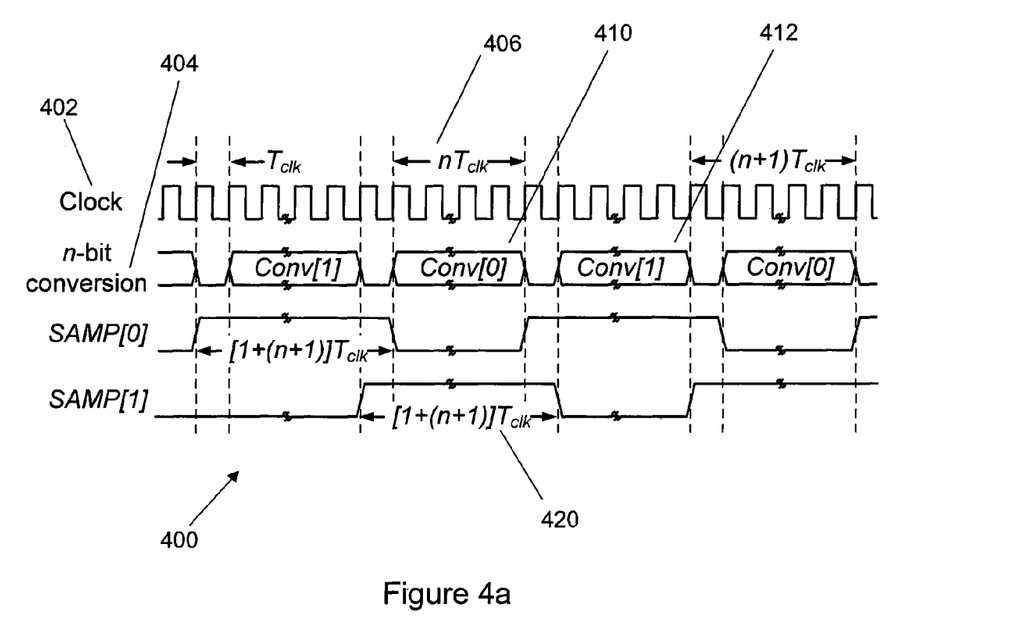
FIG. 4a shows the timing diagram of the multi-channel signal acquisition system shown in FIG. 3a in the case of sequential sampling.

FIG. 4a shows the timing diagram 400 of the multi-channel signal acquisition system 300 shown in FIG. 3a in a sequential sampling implementation. The quantization is performed under an ADC clock 402 and each clock cycle has a period of $T_{clk}$. For an n-bit quantization, a period of $nT_{clk}$ 406 is required. The n-bit conversion 404 is performed for each input channel one after another. In this example embodiment, two input channels are included, namely "Channel[0]" and "Channel[1]". Conversion for "Channel[0]" 410 takes a period of $nT_{clk}$, followed by conversion for "Channel[1]" 412 which also takes a period of $nT_{clk}$, and so on.

Since only one input channel is active during the n-bit conversion 404 and each input channel has an independent S/H circuit 314 as discussed in FIG. 3a, the sampling period is longer as compared to its counterpart in conventional approaches, and it can be up to a period of $[1+(n+1)]T_{clk}$ 420 in the case of two-channel configuration, where n is the number of bit (i.e. resolution level of the ADC). Therefore, the buffers 304 in the multi-channel signal acquisition system 300 may not a high bandwidth to drive the ADC input and may thus significantly reduce the power dissipation of the overall system.

Furthermore, instead of multiplexing the analog signal along the critical path before ADC as discussed in FIG. 1, multiplexing is performed after the quantization by comparator in the example embodiment, as shown in FIG. 3a. Consequently, the threat of signal distortion is greatly reduced in embodiments of the present invention. Moreover, channel crosstalk is minimized because every channel is now independent of each other.

Figure 3B:
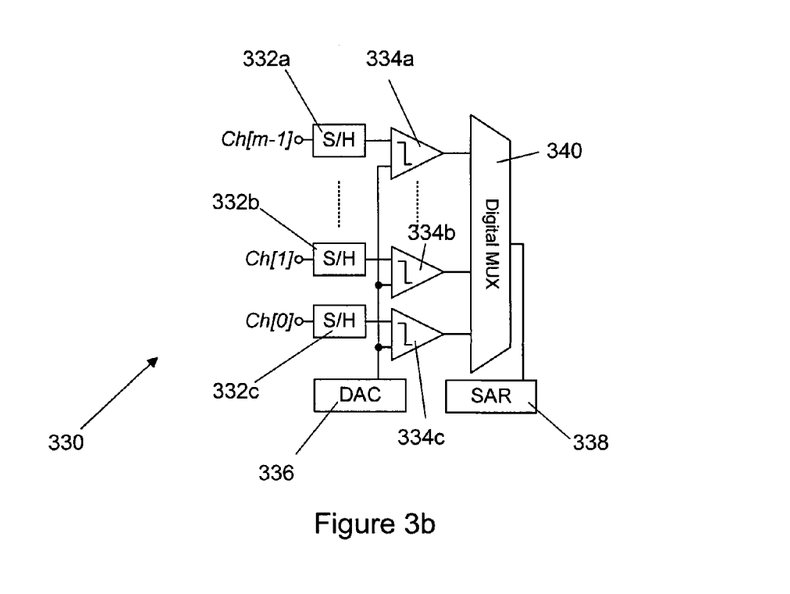
FIG. 3b shows a schematic circuit diagram of a-multi-channel ADC with an m number of input channels according to an alternate embodiment.

In the case of an m-channel implementation, m copies of input channel 312 (FIG. 3a) are needed for the ADC. FIG. 3b shows a simplified schematic diagram of a multi-channel ADC 330 according to an alternate embodiment of the ADC 310 in FIG. 3a. Here, an m-channel arrangement is shown. Similar to the embodiment shown in FIG. 3a, the ADC 330 comprises an independent S/H circuit 332a-c and comparator 334a-c for every channel, while sharing a large DAC 336 among all channels. Comparison results from the comparators 334a-c are multiplexed to a SAR 338 using a digital MUX 340. As opposed to analog multiplexing discussed in FIG. 1, this architecture can be considered as digital multiplexing since the signals are being multiplexed only after quantization. In the implementation shown in FIG. 3b, the total ADC output rate is the same as in conventional design based on ADC multiplexing in FIG. 1 and may be evenly distributed among all channels.

Figure 4B:
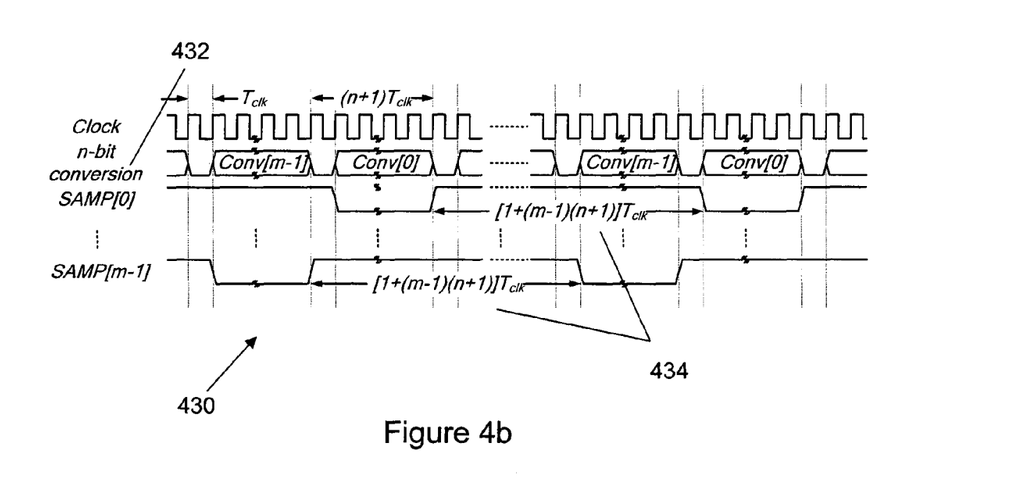
FIG. 4b shows the timing diagram of the multi-channel ADC with an m number of input channels shown in FIG. 3b.

FIG. 4b shows the timing diagram 430 of the multi-channel ADC 330 shown in FIG. 3b. As illustrated by the timing diagram 430 in FIG. 4b, an n-bit conversion 432 is performed for each input channel in a sequential order. Since only one input channel is active during conversion and each channel has an independent S/H stage 332a-c (FIG. 3b), the sampling time 434 in the example embodiment is significantly improved. As shown in FIG. 4b, the available sampling time, $t_{s2}$, is now $$t_{s2} = [1 + (m-1) \cdot (n+1)] \cdot T_{clk} \quad (1)$$

$$= [1 + (m-1) \cdot (n+1)] \cdot \frac{1}{(n+1)} \cdot \frac{1}{2 \cdot m \cdot f_{signal}}$$

$$\approx (m-1) \cdot \frac{1}{2 \cdot m \cdot f_{signal}}.$$

where m is the number of channels, n is the number of ADC resolution, $T_{clk}$ is the duration of one clock cycle, and $f_{signal}$ is the input signal bandwidth.

By lengthening the sampling time, the ADC in the example embodiment may effectively allow a larger window for signal settling. Table I shows results comparing system bandwidth and slew-rate requirements between a prior art approach and the example embodiment in the case of 8-channel 8-bit system. It shows that the multi-channel ADC based on time-interleaved S/H stage architecture of the example embodiment can provide 64 times longer sampling time. Thus, both of the bandwidth and slew rate requirements are relaxed by about 63 times. From a system perspective, the multi-channel ADC of the example embodiment can readily support multiple channels with minimum overhead on buffer.

TABLE I

| Architecture | Analog Multiplexing | Digital Multiplexing in Example Embodiment |
|---|---|---|
| Sampling time | $T_{clk}$ | 64 $T_{clk}$ |
| Holding time | 8 $T_{clk}$ | 8 $T_{clk}$ |
| Required bandwidth | 143 $f_{signal}$ | 2.27 $f_{signal}$ |
| Required slew rate | 144 FS · $f_{signal}$ | 2.29 FS · $f_{signal}$ |

Figure 5:
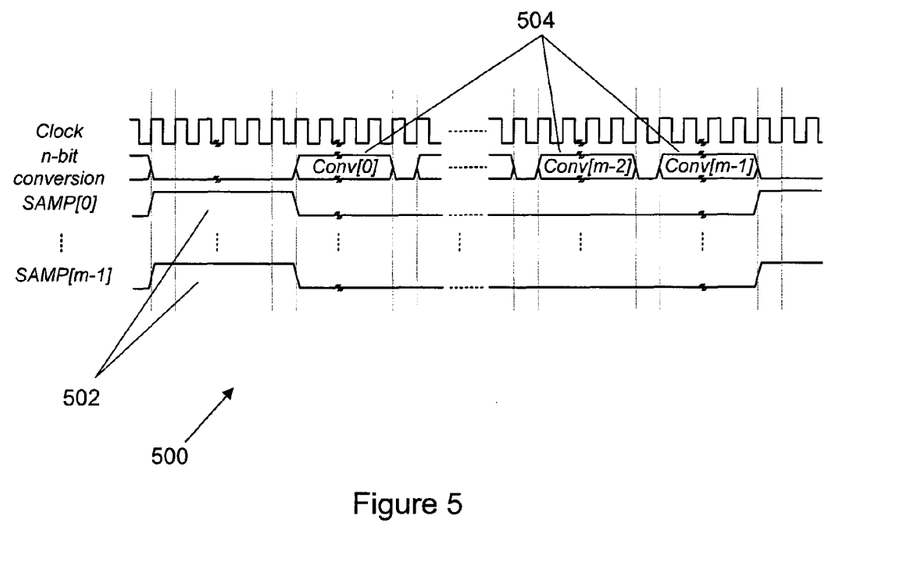
FIG. 5 shows the timing diagram of the multi-channel ADC shown in FIG. 3a in the case of simultaneous sampling.

In alternate embodiments with multiple channels, the sampling can be sequentially, partially simultaneously or simultaneously. FIG. 5 shows a timing diagram 500 in which the m-channel ADC 330 (FIG. 3b) can be used to perform simultaneous sampling. In this case, the sampling for all channels 502 are at the same instant, while the n-bit conversions 504 are performed afterward in sequential order.

Figure 6:
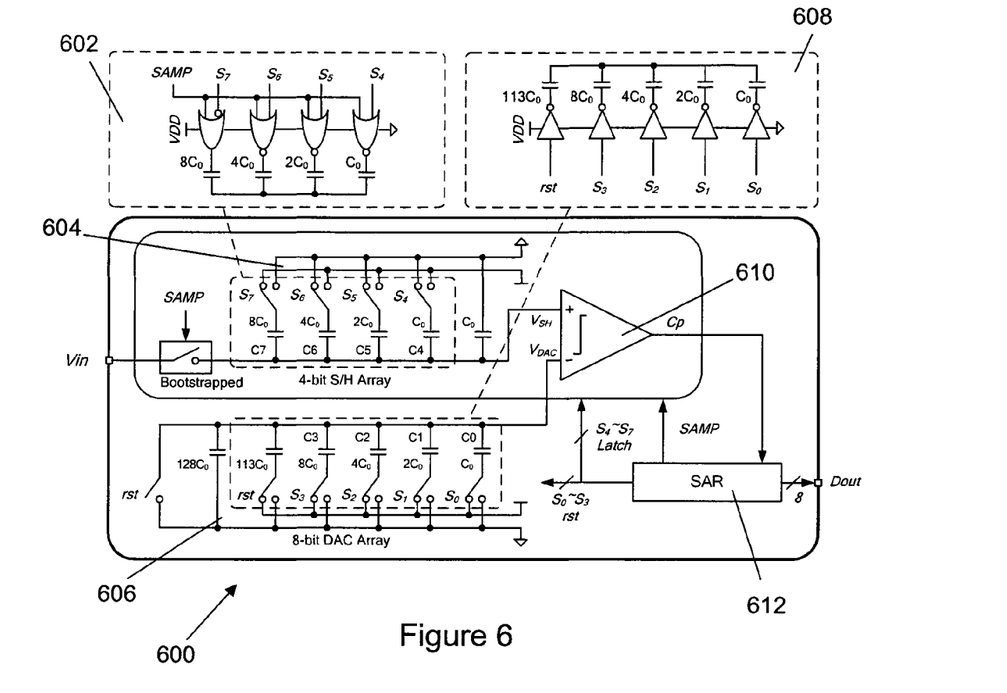
FIG. 6 shows a schematic circuit diagram illustrating a successive approximation (SA) ADC according to an example embodiment.

FIG. 6 shows a simplified circuit diagram illustrating a SA ADC 600 according to an example embodiment. The SA ADC 600 in FIG. 6 uses a dual-capacitor-array architecture for SA ADC implementation. Instead of using single sampling capacitor, a capacitive array 602 is used to implement the S/H stage 604. The S/H circuit 604 performs both signal sampling and quantization. For example, the S/H circuit 604 is responsible for coarse conversion, while a DAC 606 is responsible for fine conversion, as will be described in detail below. In the example embodiment shown in FIG. 6, DAC is implemented using capacitive array. However, it will be appreciated by a person skilled in the art that the DAC may be implemented using other DAC structures (e.g. resistor ladder, current steering, etc.). In the example shown in FIG. 6, only one input channel is shown, and the comparator 610 is specific to this channel, while the SAR 612 is shared with other channels (not shown in FIG. 6).

Figure 7:
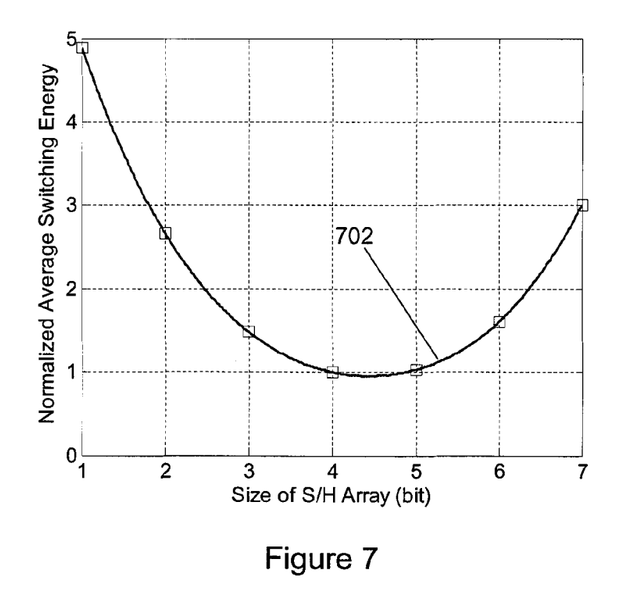
FIG. 7 shows a graph of normalized average switching energy versus size of the S/H array based on simulation results.

In the example embodiment, the S/H array 602 is binary-weighted and has an array size between 1 bit and n−1 bits for an n-bit ADC design. For example, in the case of an 8-bit ADC, the normalized average switching energy for different S/H array sizing is lowest if a 4 or 5-bits S/H array 602 is introduced on the top of the 8-bit DAC array 608, as shown by line 702 in FIG. 7. However, with the same unit capacitor size, a 5-bit array may require twice the area as compared to a 4-bit array. Thus, in the example shown in FIG. 6, a 4-bit array size is chosen. In preferred embodiments, a (n/2)-bit S/H array size is used for an n-bit ADC. The DAC array 608 in the implementation shown in FIG. 6 has an array size equal to the resolution level of the ADC, i.e. n-bits. However, it will be appreciated by a person skilled in the art that the array size of the S/H array and/or DAC array 608 can be varied in alternate embodiments.

Table II shows detailed state transition for the ADC 600 of the example embodiment shown in FIG. 6. As described, the successive approximation is performed on both S/H and DAC arrays. With reference to Table II, an analog-to-digital (AD) conversion usually starts from Cycle 0 in which the signal is being sampled onto the S/H array 602 (FIG. 6) while DAC array 608 (FIG. 6) is purged of residue value by shorting both of the top and bottom plate to GND. Throughout sampling period, a capacitor C7 on S/H array 602 is switched to VDD, and sampling is performed using top plate. As compared to bottom-plate sampling, this arrangement demands only one sampling switch and may thus reduce the complexity in circuit implementation.

TABLE II

| | | | | Switching on Capacitive Array | | | | | | | | |
|---|---|---|---|---|---|---|---|---|---|---|---|---|
| | | | | S/H Array | | | | DAC Array | | | | |
| Cycle | State | Dout | SAMP | $S_7$ | $S_6$ | $S_5$ | $S_4$ | $S_3$ | $S_2$ | $S_1$ | $S_0$ | rst |
| 0 | Sampling with Purging of DAC | — | 1 | 0 | 1 | 1 | 1 | 1 | 1 | 1 | 1 | 1 |
| | Sampling without Purging of DAC | — | 1 | 0 | 1 | 1 | 1 | 0 | 0 | 0 | 0 | 0 |
| 1 | Successive | $D_7 = Cp_7$ | 0 | $Cp_7$ | 0 | 1 | 1 | 0 | 0 | 0 | 0 | 0 |
| 2 | Approximation | $D_6 = Cp_6$ | 0 | $Cp_7$ | $Cp_6$ | 0 | 1 | 0 | 0 | 0 | 0 | 0 |
| 3 | | $D_5 = Cp_5$ | 0 | $Cp_7$ | $Cp_6$ | $Cp_5$ | 0 | 0 | 0 | 0 | 0 | 0 |
| 4 | | $D_4 = Cp_4$ | 0 | $Cp_7$ | $Cp_6$ | $Cp_5$ | $Cp_4$ | 1 | 0 | 0 | 0 | 0 |
| 5 | | $D_3 = Cp_3$ | 0 | $Cp_7$ | $Cp_6$ | $Cp_5$ | $Cp_4$ | $\overline{Cp_3}$ | 1 | 0 | 0 | 0 |
| 6 | | $D_2 = Cp_2$ | 0 | $Cp_7$ | $Cp_6$ | $Cp_5$ | $Cp_4$ | $\overline{Cp_3}$ | $\overline{Cp_2}$ | 1 | 0 | 0 |
| 7 | | $D_1 = Cp_1$ | 0 | $Cp_7$ | $Cp_6$ | $Cp_5$ | $Cp_4$ | $\overline{Cp_3}$ | $\overline{Cp_2}$ | $\overline{Cp_1}$ | 1 | 0 |
| 8 | | $D_0 = Cp_0$ | 0 | $Cp_7$ | $Cp_6$ | $Cp_5$ | $Cp_4$ | $\overline{Cp_3}$ | $\overline{Cp_2}$ | $\overline{Cp_1}$ | $\overline{Cp_0}$ | 0 |

Figure 8:
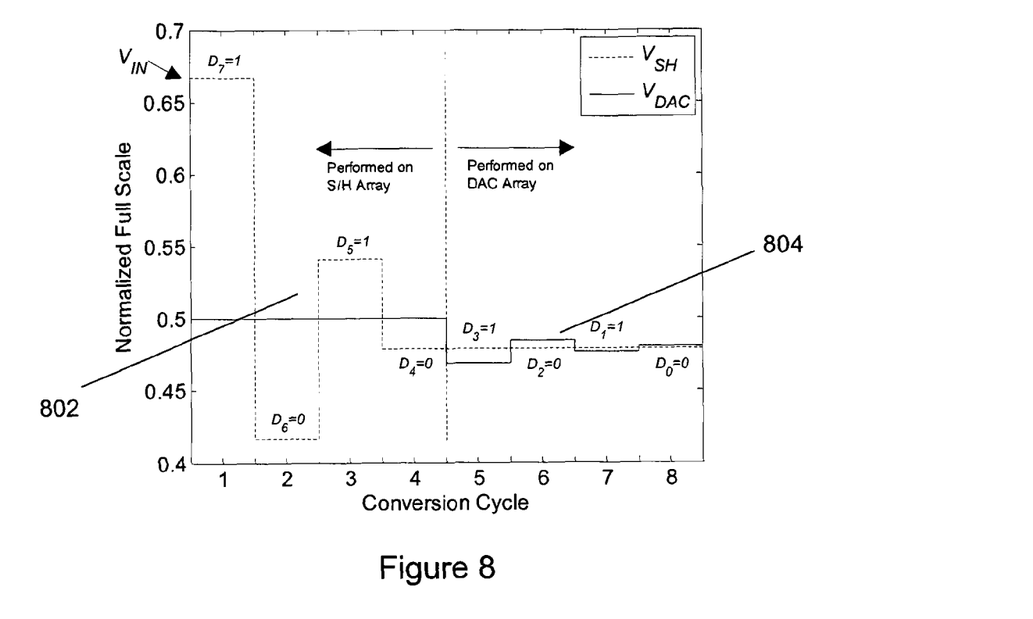
FIG. 8 shows a diagram illustrating an example of signal conversion using the ADC of FIG. 6.

Note:
$S_{0:7} = 0 \rightarrow$ switched to VDD, $S_{0:7} = 1 \rightarrow$ switched to GND; rst = 0 $\rightarrow$ switched to VDD or high impedance, rst = 1 $\rightarrow$ shorted to GND; $Cp_{0:7}$ are the comparator output FIG. 8 shows a schematic diagram illustrating an example signal conversion using the dual-capacitive-array structure as well as the capacitive array outputs, $V_{SH}$ and $V_{DAC}$, as shown in FIG. 6. In this example, the sampled input voltage, $V_{IN}$, is two third of the normalized ADC full scale (FS) which corresponds to a digital output of 10101010. The ADC FS is equal to VDD in the case of rail-to-rail ADC. The digital output code is generated based on comparator output, Cp, from MSB to LSB. In the example, the successive approximation of first four bits are performed using capacitors C4 to C7 on the 4-bit S/H array 602, while the remaining four bits using C0 to C3 on the 8-bit DAC array 608 (FIG. 6). From Cycles 1 to 4, $V_{DAC}$ serves as reference at half of VDD and the sampled $V_{IN}$ on S/H array converges toward $V_{DAC}$ through successive subtractions or additions. After Cycle 4, $V_{SH}$ is held constant and AD conversion continues using DAC array through Cycles 5 to 8. With reference to FIG. 8, the resolution of the bits can be summarized as follows:

| Cycle | $V_{SH}$ | Comparison | $V_{DAC}$ | D |
|---|---|---|---|---|
| 1 | 0.66667 | > | 0.5 | 1 |
| 2 | 0.41667 (0.6667 − 0.5 + 0.25) | < | 0.5 | 0 |
| 3 | 0.54167 (0.41667 + 0.125) | > | 0.5 | 1 |
| 4 | 0.47917 (0.54167 − 0.125 + 0.0625) | < | 0.5 | 0 |
| 5 | 0.47917 | > | 0.46875 (0.5 − 0.03125) | 1 |
| 6 | 0.47917 | < | 0.484375 (0.46875 + 0.03125 − 0.015625) | 0 |
| 7 | 0.47917 | > | 0.4765625 (0.484375 − 0.0078125) | 1 |
| 8 | 0.47917 | < | 0.48046875 (0.4765625 + 0.0078125 − 0.00390625) | 0 |

At the end of conversion, all capacitors C0 to C7 are switched back to their default positions and the ADC operation restarts at Cycle 0. Considering the state transition in Table II and the conversion example in FIG. 8, it can be proved that the $V_{SH}$ at the end of conversion is given by $$V_{SH} = V_{IN} - VDD(2^{-1} - 2^{-1} \cdot \overline{D_7} - 2^{-2} \cdot \overline{D_6} - 2^{-3} \cdot \overline{D_5} - 2^{-4} \cdot \overline{D_4}), \quad (2)$$

where $D_i$ is i-th bit and $\overline{D_i}$ is the complement of i-th bit. On the other hand, $V_{DAC}$ is given by $$V_{DAC} = VDD(2^{-1} - 2^{-5} \cdot \overline{D_3} - 2^{-6} \cdot \overline{D_2} - 2^{-7} \cdot \overline{D_1} - 2^{-8} \cdot \overline{D_1}). \quad (3)$$

Taking into account all possible values for $V_{SH}$ and $V_{DAC}$, it can be proved that the common-mode voltage, $V_{CM}$, of the comparator inputs is limited to $$\frac{VDD}{2} - \frac{2^4 \cdot VDD}{2^8} \leq V_{CM} \leq \frac{VDD}{2}. \quad (4)$$

By limiting the common-mode input range of comparator, the dual-capacitive-array ADC of the example embodiments may attain rail-to-rail full scale range without the need of rail-to-rail comparator. Consequently, common-mode dependent nonlinearity associated with rail-to-rail comparator may be avoided.

Figure 9:
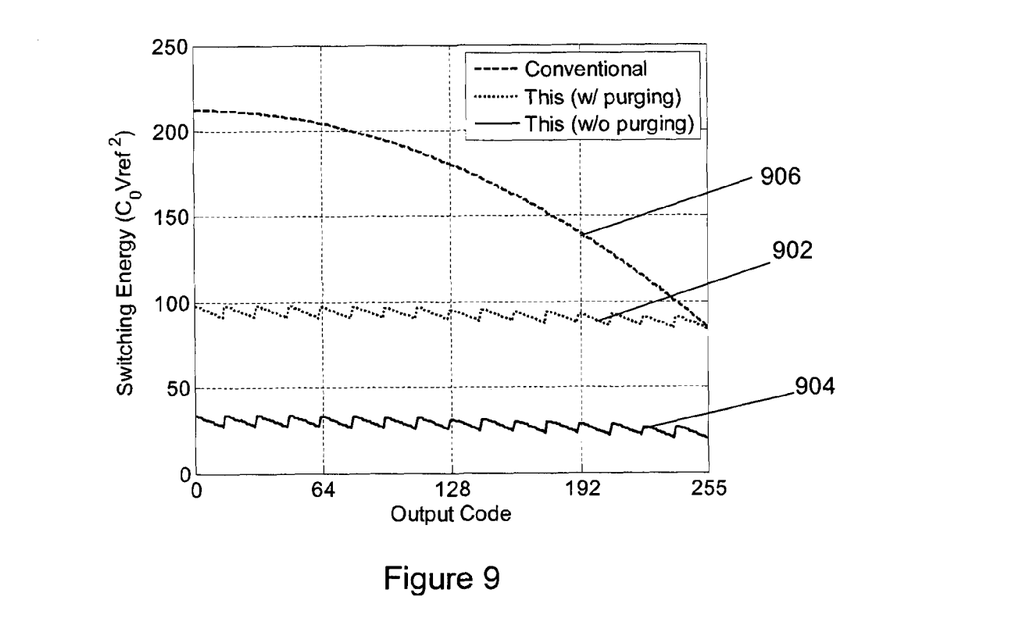
FIG. 9 shows graphs of simulated switching energies versus output code for different implementations.

As shown in the conversion example in FIG. 8, approximation steps with larger changes in voltage level, i.e. coarse resolution or conversion 802, are actually performed using the smaller S/H array 602 (FIG. 6) while approximation steps with smaller changes in voltage level, i.e. finer resolution 804, are resolved using the larger DAC array 608 (FIG. 6). Since the switching energy is proportional to a total capacitance to be switched and changes in voltage level, the switching energy required by each successive approximation step can be considerably reduced in the ADC of the example embodiments. Furthermore, the purging of DAC array after every conversion is not necessary. As a result, switching of the S/H array and DAC array back to their default positions after each conversion involve only relatively smaller capacitors, i.e. C4 to C7 on the S/H array and C0 to C3 on the DAC array. In other words, the dual-capacitive-array structure of the example embodiments can effectively achieve higher-energy-efficiency by retaining most of the charge stored in the DAC array after each conversion. The simulated switching energies in capacitive array with respect to the ADC output code are shown in FIG. 9. As can be seen from lines 902 and 904, the dual-capacitive-array structure as described above consumes significantly less switching energy and it is less dependent on ADC output code, as compared to a conventional approach denoted by line 906. In one example, even if purging of the DAC array is performed for each conversion (e.g. line 902), the proposed structure may save as much as 45% of switching energy. Moreover, a further saving of 38% may be achievable when purging of DAC array after every conversion is not executed (e.g. line 904). The achieved saving is about 83% in total in that case.

Figure 10:
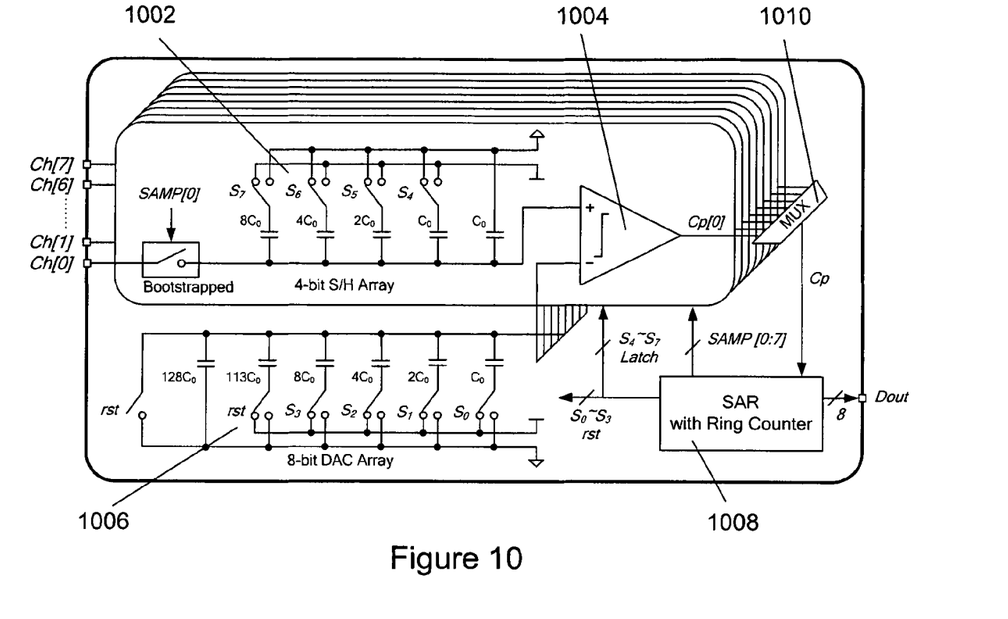
FIG. 10 shows a schematic circuit diagram illustrating the ADC of FIG. 6 in a multi-channel implementation.

FIG. 10 shows a schematic circuit diagram of the ADC of FIG. 6 in a multi-channel implementation, e.g. 8-channel. As shown in FIG. 10, each channel has an independent S/H circuit 1002 and comparator 1004, while a DAC 1006 are common for all channels. Comparison results from comparators 1004 of the respective channels are multiplexed to a SAR 1008 using a digital MUX 1010. The state transition shown in Table II is now rewritten as in Table III (see below) for the ADC of FIG. 10. Table III shows the state transition for one of the ADC channels. As opposed to the single-channel embodiment in Table II, a signal SAMP[m] (where m=0:7) is used to clock-gate the S/H array or toggle the successive approximation among different channels. For the first 63 cycles (Cycle 0 to Cycle 62), the respective S/H array is in sampling mode while the shared DAC array is performing successive approximation on other channels and any switching on DAC array is irrelevant at this moment. Sampling continues into Cycle 63 and the DAC is reset for successive approximation. In the last 8 cycles, clock-gating is disabled (i.e. SAMP[m]="0") and an 8-bit successive approximation will be carried out for this specific channel in order to produce the corresponding digital output code.

still limited by the capacitor matching within each array. In one implementation a customized 8.5 μm×8.5 μm metal-insulator-metal (MIM) capacitor is used as the unit capacitor to achieve the required matching according to process document. The resulting unit capacitance value in such implementation is about 153 fF. Consequently, the total capacitances for S/H array and DAC array are about 2.5 pF and 40 pF, respectively. Both capacitive arrays are formed using the carefully drawn unit capacitor to achieve better matching, while dummy capacitors are added at the edges of the array so that all capacitors see similar surrounding condition. In alternate embodiments, other type of capacitors, e.g. metal-finger capacitor, poly-insulator-poly (PIP) capacitor, etc. as would be appreciated by a person skilled in the art, may be used as the unit capacitor.

Also, as shown in FIG. 6, the switches in the capacitive arrays (see 602 and 608 in FIG. 6) are implemented by logic gates because they only toggle between VDD and GND under rail-to-rail operation. This may reduces the circuit complexity and power dissipation in the switch array by avoiding the use of additional transmission gates or clock-boosting switches. Both S/H and DAC arrays are designed to settle within half a clock cycle and the requirement is set by

TABLE III

| | | | | Switching on Capacitive Array | | | | | | | | |
|---|---|---|---|---|---|---|---|---|---|---|---|---|
| | | | | S/H Array | | | | DAC Array | | | | |
| Cycle | State | Dout | SAMP[m] | $S_7$ | $S_6$ | $S_5$ | $S_4$ | $S_3$ | $S_2$ | $S_1$ | $S_0$ | rst |
| 0-62 | Sampling | — | 1 | X | X | X | X | X | X | X | X | X |
| 63 | Sampling with Purging of DAC | — | 1 | 0 | 1 | 1 | 1 | 1 | 1 | 1 | 1 | 1 |
| | Sampling without Purging of DAC | — | 1 | 0 | 1 | 1 | 1 | 0 | 0 | 0 | 0 | 0 |
| 64 | Successive | $D_7 = Cp_7$ | 0 | $Cp_7$ | 0 | 1 | 1 | 0 | 0 | 0 | 0 | 0 |
| 65 | Approximation | $D_6 = Cp_6$ | 0 | $Cp_7$ | $Cp_6$ | 0 | 1 | 0 | 0 | 0 | 0 | 0 |
| 66 | | $D_5 = Cp_5$ | 0 | $Cp_7$ | $Cp_6$ | $Cp_5$ | 0 | 0 | 0 | 0 | 0 | 0 |
| 67 | | $D_4 = Cp_4$ | 0 | $Cp_7$ | $Cp_6$ | $Cp_5$ | $Cp_4$ | 1 | 0 | 0 | 0 | 0 |
| 68 | | $D_3 = Cp_3$ | 0 | $Cp_7$ | $Cp_6$ | $Cp_5$ | $Cp_4$ | $\overline{Cp_3}$ | 1 | 0 | 0 | 0 |
| 69 | | $D_2 = Cp_2$ | 0 | $Cp_7$ | $Cp_6$ | $Cp_5$ | $Cp_4$ | $\overline{Cp_3}$ | $\overline{Cp_2}$ | 1 | 0 | 0 |
| 70 | | $D_1 = Cp_1$ | 0 | $Cp_7$ | $Cp_6$ | $Cp_5$ | $Cp_4$ | $\overline{Cp_3}$ | $\overline{Cp_2}$ | $\overline{Cp_1}$ | 1 | 0 |
| 71 | | $D_0 = Cp_0$ | 0 | $Cp_7$ | $Cp_6$ | $Cp_5$ | $Cp_4$ | $\overline{Cp_3}$ | $\overline{Cp_2}$ | $\overline{Cp_1}$ | $\overline{Cp_0}$ | 0 |

Figure 11A:
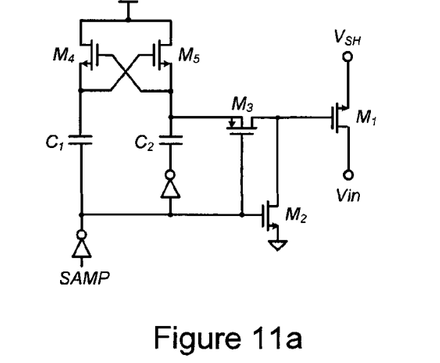
FIG. 11a shows a schematic circuit diagram of the main switch of the S/H circuit according to an example embodiment.
Figure 11B:
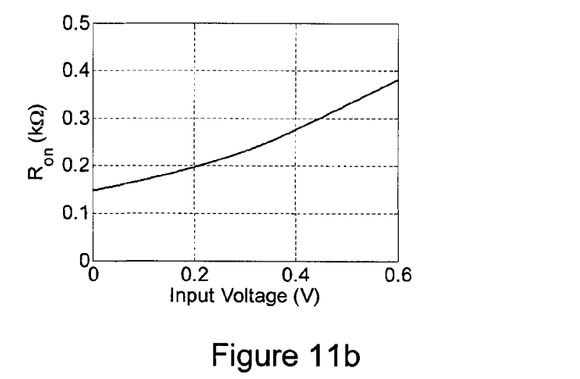

Note:
$S_{0:7} = 0 \rightarrow$ switched to VDD, $S_{0:7} = 1 \rightarrow$ switched to GND; rst = 0 $\rightarrow$ switched to VDD or high impedance, rst = 1 $\rightarrow$ shorted to GND; $Cp_{0:7}$ are the comparator output; X $\rightarrow$ don't care In addition, in the example embodiment, a clock-boosting S/H switch is used to realize rail-to-rail input range under low supply voltage. As shown in FIGS. 11a-11b, the gate voltage of transistor M1 is boosted to 2×VDD during sampling in order to achieve small on resistance $R_{on}$. In one implementation, both of the boosting capacitors C1 and C2 are chosen to be 1 pF so that the boosted voltage is unaffected by parasitic capacitance associated with the gate node of transistor M1. According to simulation result, resistance $R_{on}$ with chosen width/length (W/L) ratio of 30 is less than 0.4 kΩ over the entire input range. With an S/H array total capacitance of 2.5 pF, the bandwidth is estimated to be more than 160 MHz. This may guarantee that the sampling accuracy is not restricted by the S/H switch for an ADC sampling rate of 30 kS/s-per-channel.

In the example embodiments, the unit capacitance $C_0$ may be limited by the process matching parameter and layout design rule. Since the S/H array and DAC array are independent of each other, any mismatch between arrays does not affect the ADC linearity. However, the ADC linearity may $$FS \cdot e^{-\frac{T_{clk}/2}{\tau_{array}}} < \frac{FS}{2^{n+1}} \Rightarrow \tau_{array} < \frac{T_{clk}}{2 \cdot (n+1) \cdot \ln 2}. \quad (5)$$

Based on Equation (5), all switches are sized in the example embodiments by considering the propagation delay of a logic gate driving a capacitive load. For example, to achieve 8-bit resolution and 240 kS/s total sampling rate for an 8-channel design, $T_{array}$ is set to be less than 37 ns.

Figure 12:
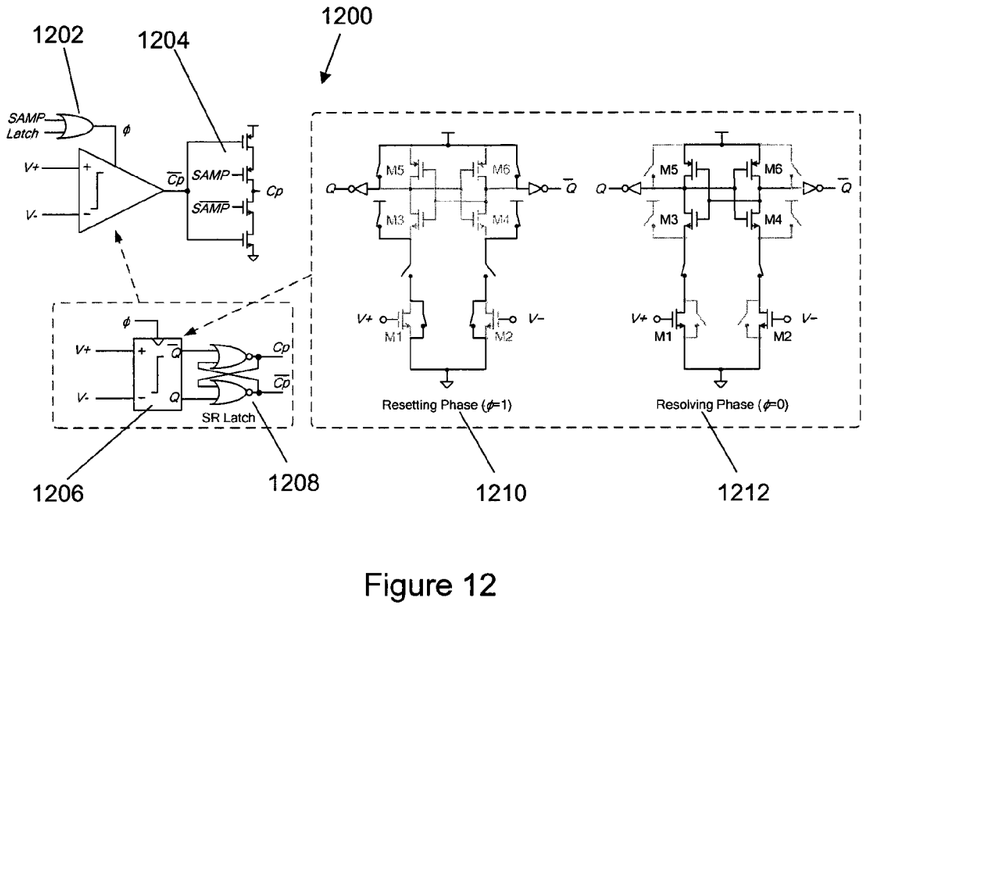
FIG. 12 show a block diagram, a schematic diagram- and a detailed circuit diagram respectively of a comparator according to an example embodiment.

FIG. 12 shows a simplified schematic circuit diagram illustrating a comparator 1200 according to an example embodiment. An OR gate 1202 is used to clock-gate the comparator based on signal SAMP. A clocked inverter 1204 is introduced at the output to realize the digital multiplexing. Here, the comparator 1200 is implemented based on dynamic latch 1206. It has no analog pre-amplifier in order to eliminate static current consumption. Comparator inputs, V+ and V−, are connected to S/H circuit 604 and DAC 606 (FIG. 6). According to Equation (4), the required common-mode input range is 0.26 V to 0.3 V for a 0.6-V supply. This is achieved in the example embodiment using a NMOS input pair. The input pair, transistors M1 and M2, has a common-mode input range of 0.17 V to 0.6 V, satisfying the given specification. Additionally, their W/L ratio is designed to be 100 times to obtain a comparator bandwidth of about 50 MHz so that the ADC conversion rate is not constrained by the speed of the comparator.

With reference to FIG. 12, the comparator 1200 operates in two phases, e.g. resetting 1210 and resolving 1212 phases. During the resetting phase 1210, all of the nodes are reset to minimize the comparator hysteresis. During the resolving phase 1212, the comparator compares the inputs and produces the digital output. The pulling currents produced by the input pair triggers the positive feedback cross-coupled pair, formed by transistors M3 to M6, and generate the comparison result. As shown in FIG. 12, the comparator uses a set-reset (SR) latch 1208 to hold the output during resetting phase.

Figure 13:
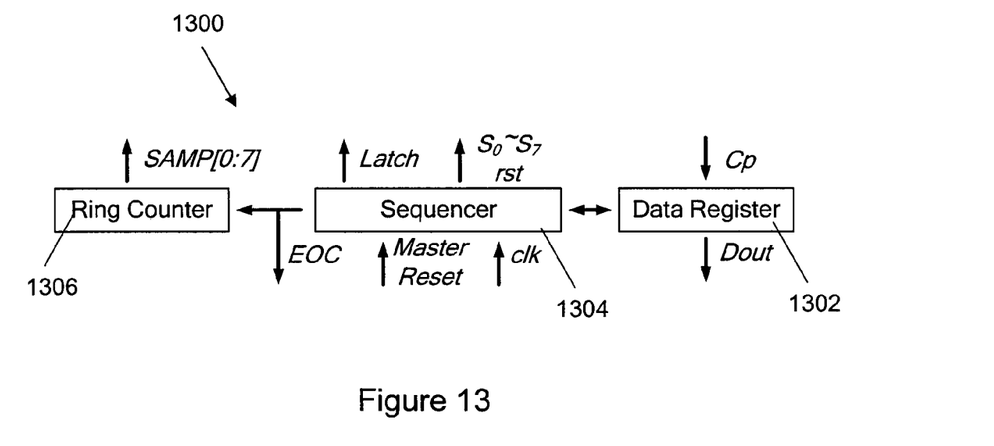
FIG. 13 shows a block diagram of a SAR according to an example embodiment.

FIG. 13 shows a block diagram illustrating a SAR 1300 according to an example embodiment in the case of sequential sampling configuration. However, it will be appreciated by a person skilled in the art that the SAR may be reconfigured to generate different control and/or clock-gating signals to achieve sequential, partially simultaneous or simultaneous sampling. The SAR 1300 is a finite state machine that produces the control signals based on successive approximation algorithm to control and synchronize the ADC operation. In the example implementation, the SAR 1300 may be synthesized from a VERILOG description based on the state transition described in Table II and/or Table III. The SAR 1300 comprises a data register 1302 and bit-cycling sequencer 1304. Signals $S_4$-$S_7$ and Latch generated by sequencer 1304 are connected to all S/H arrays and comparators of different channels for controlling the switches in capacitive arrays 602, 608 (FIG. 6) and the comparator 1200 (FIG. 12) respectively.

In an example embodiment, the SAR 1300 includes an additional ring counter 1306 to toggle AD conversion among the 8 channels. However, only one channel is active for conversion based on the SAMP signal generated through the ring counter 1306. For example (see Table III), when SAMP is '1', the respective channel is performing sampling. In contrast, the channel is active for conversion if SAMP is '0'. In one embodiment, the input signals from different channels are sampled sequentially (i.e. there is no overlapping in the sampling times between different channels). In an alternate embodiment, the input signals from different channels are sampled at least partially simultaneously (i.e. there is some overlapping in the sampling times between different channels), as illustrated in FIG. 5. During successive approximation, the sequencer 1304 performs bit-cycling on both S/H array (using $S_4$-$S_7$) and DAC array (using $S_0$-$S_3$) according to the comparison result from comparator to produce the digital output code, from MSB to LSB. At the end of each conversion, an end-of-conversion (EOC) signal is asserted and the conversion continues on subsequent channel.

Figure 14:
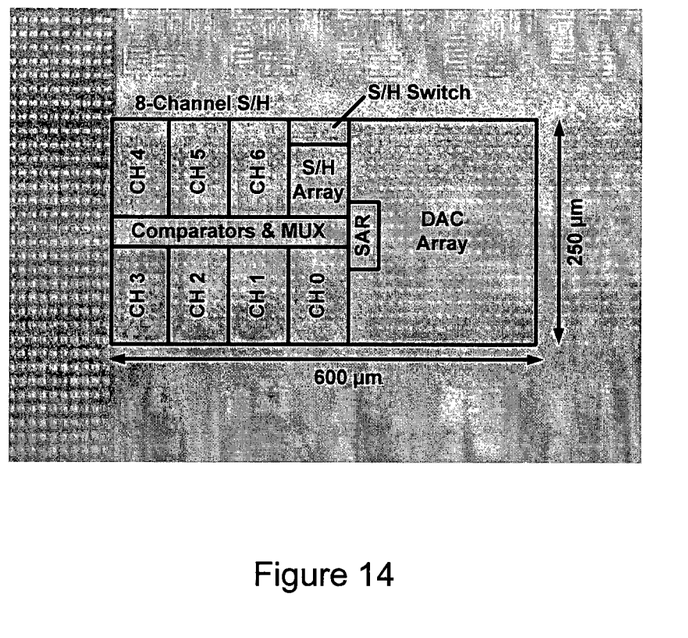
FIG. 14 shows a die photo of an example implementation of the ADC of FIG. 10.

FIG. 14 shows a die photo of an example implementation of the ADC of FIG. 10. The ADC in FIG. 14 may be fabricated in a 0.13-µm single-poly eight-metal (1P8M) CMOS process without using any high-$V_t$ or low-$V_t$ devices and packaged in low profile quad flat pack (LQFP) package. The core occupies a silicon area of 600 µm×250 µm.

As described, the example embodiments allow using a multi-channel system to provide a relatively longer sampling period for each input. This may effectively eliminate the use of a high bandwidth and high slew rate buffer which dissipates excessive power. Furthermore, embodiments of the present invention may eliminate the use of an analog multiplexer in an analog signal path, thereby removing the threat of signal distortion caused by the analog multiplexer. Lastly, channel crosstalk is minimized because every channel is now independent of each other.

Figure 15:
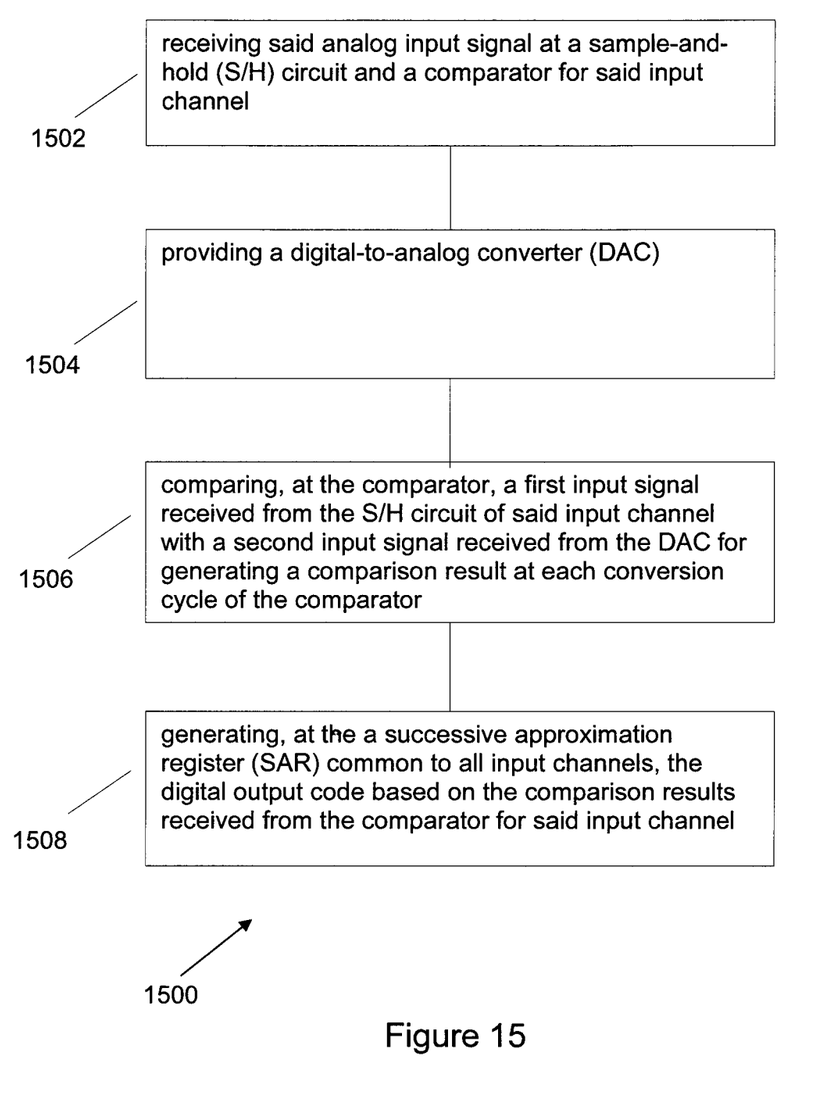
FIG. 15 shows a flow chart illustrating a method of generating a digital output code from an analog input signal received at an input channel of a plurality of input channels according to an example embodiment.

FIG. 15 shows a flow chart 1500 illustrating a method of generating a digital output code from an analog input signal received at an input channel of a plurality of input channels according to an example embodiment. At step 1502, said analog input signal is received at a sample-and-hold (S/H) circuit and a comparator for said input channel. At step 1504, a digital-to-analog converter (DAC) is provided. At step 1506, a first input signal received from the S/H circuit of said input channel is compared with a second input signal received from the DAC at the comparator for generating a comparison result at each conversion cycle of the comparator. At 1508, the digital output code is generated at the successive approximation register (SAR) common to all input channels based on the comparison results received from the comparator for said input channel.

Figure 16:
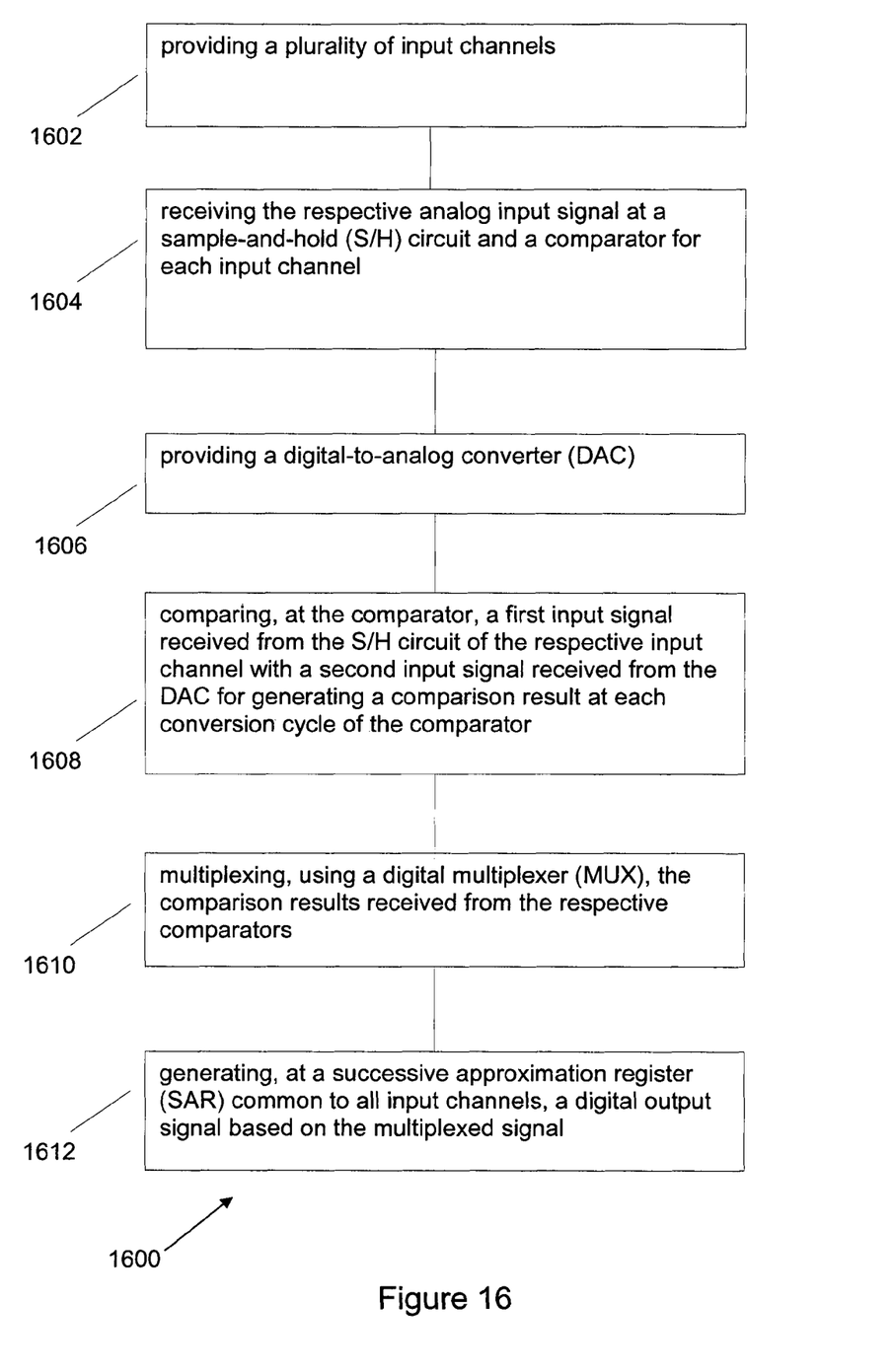
FIG. 16 shows a flow chart illustrating a method of converting a plurality of analog input signals to a digital output signal according to an example embodiment.

FIG. 16 shows a flow chart 1600 illustrating a method of converting a plurality of analog input signals to a digital output signal according to an example embodiment. At step 1602, a plurality of input channels are provided. At step 1604, the respective analog input signal is received at a sample-and-hold (S/H) circuit and a comparator for each input channel. At step 1606, a digital-to-analog converter (DAC) is provided. At step 1608, a first input signal received from the S/H circuit of the respective input channel is compared with a second input signal received from the DAC at the comparator for generating a comparison result at each conversion cycle of the comparator. At step 1610, the comparison results received from the respective comparators are multiplexed using a digital multiplexer (MUX). At step 1612 a digital output signal is generated at a successive approximation register (SAR) common to all input channels based on the multiplexed signal.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. An analog-to-digital converter (ADC) for a multi-channel signal acquisition system, the ADC comprising:
   a sample-and-hold (S/H) circuit for each input channel, and operable to receive a respective analog input signal for each input channel;
   a digital-to-analog converter (DAC) common to all input channels;
   a comparator for each input channel, said comparator configured to receive an output signal from the S/H circuit of the respective input channel as a first input signal, and an output signal from the DAC as a second input signal, for generating a comparison result at each conversion cycle of the comparator; and
   a successive approximation register (SAR) common to all input channels and configured to generate, for each input channel, a digital output code based on the comparison results received from the respective comparator, wherein the S/H circuit and the DAC each comprises a capacitor array, so that the S/H circuit performs coarse conversion and the DAC performs fine conversion.

2. The ADC as claimed in claim 1, wherein the SAR is further configured to generate control signals based on the comparison result at each conversion cycle of the comparator, for controlling switches in the respective S/H circuit and in the DAC.

3. The ADC as claimed in claim 2, wherein, in the coarse conversion, the second input signal is constant and the SAR is configured to control the switches in the S/H circuit such that the comparator successively compares the first input signal against the constant second input signal for generating comparison results corresponding to a first portion of the digital code.

4. The ADC as claimed in claim 3, wherein, in the fine conversion, the first input signal is constant and the SAR is configured to control the switches in the DAC such that the comparator successively compares the second input signal against the constant first input signal, for generating comparison results corresponding to a remaining second portion of the digital output code.

5. The ADC as claimed in claim 2, wherein the switches in the respective S/H circuit and in the DAC comprise logic gates.

6. The ADC as claimed in claim 2, wherein the capacitor array of the respective S/H circuit and the DAC each comprises a unit capacitor selected from a group consisting of a metal-insulator-metal (MIM) capacitor, a metal-finger capacitor, and a poly-insulator-poly (PIP) capacitor.

7. The ADC as claimed in claim 1, wherein the S/H circuits are configured to simultaneously sample two or more of the respective analog input signals.

8. The ADC as claimed in claim 1, wherein the S/H circuits are configured to sample the respective analog input signals sequentially.

9. The ADC as claimed in claim 8, wherein the S/H circuits of the respective input channels are independent of each other such that a maximum sampling time of each S/H circuit is determined based on the equation:

$$t_{s2} = [1 + (m-1)\cdot(n+1)]\cdot T_{clk} \approx (m-1)\cdot \frac{1}{2\cdot m\cdot f_{signal}}$$

where $t_{s2}$ is the maximum sampling time, m is the number of input channels, n is the resolution level of the ADC, $T_{clk}$ is the duration of one clock cycle, and $f_{signal}$ is the input signal bandwidth.

10. A signal acquisition system comprising:
a plurality of input channels;
an analog-to-digital converter (ADC) comprising:
 a sample-and-hold (S/H) circuit for each input channel, and operable to receive a respective analog input signal for each input channel;
 a digital-to-analog converter (DAC) common to all input channels;
 a comparator for each input channel, said comparator configured to receive an output signal from the S/H circuit of the respective input channel as a first input signal, and an output signal from the DAC as a second input signal, for generating a comparison result at each conversion cycle of the comparator; and
 a successive approximation register (SAR) common to all input channels and configured to generate a digital output signal; and
a digital multiplexer (MUX) configured to receive the comparison results from the respective comparators as inputs and multiplex said comparison results prior to inputting to the SAR for generating the digital output signal, wherein the S/H circuit and the DAC each comprises a capacitor array, so that the S/H circuit performs coarse conversion and the DAC performs fine conversion.

11. The signal acquisition system as claimed in claim 10, wherein the S/H circuits are configured to simultaneously sample two or more of the respective analog input signals.

12. The signal acquisition system as claimed in claim 10, wherein the S/H circuits are configured to sample the respective analog input signals sequentially.

13. The signal acquisition system as claimed in claim 12, wherein the S/H circuits of the respective input channels are independent of each other such that a maximum sampling time of each S/H circuit is determined based on the equation:

$$t_{s2} = [1 + (m-1)\cdot(n+1)]\cdot T_{clk} \approx (m-1)\cdot \frac{1}{2\cdot m\cdot f_{signal}}$$

where $t_{s2}$ is the maximum sampling time, m is the number of input channels, n is the resolution level of the ADC, $T_{clk}$ is the duration of one clock cycle, and $f_{signal}$ is the input signal bandwidth.

14. A method of generating a digital output code from an analog input signal received at an input channel of a plurality of input channels, the method comprising the steps of:
receiving said analog input signal at a sample-and-hold (S/H) circuit to perform coarse conversion;
performing a fine conversion for each input channel at a digital-to-analog converter (DAC);
comparing, at a comparator, a first input signal received from the S/H circuit of said input channel with a second input signal received from the DAC for generating a comparison result at each conversion cycle of the comparator; and
generating, at the a successive approximation register (SAR) common to all input channels, the digital output code based on the comparison results received from the comparator for said input channel, wherein the S/H circuit and the DAC each comprises a capacitor array.

15. The method as claimed in claim 14, wherein the coarse conversion comprises maintaining the second input signal constant, and configuring the SAR to control switches in the S/H circuit such that the comparator successively compares the first input signal against the constant second input signal for generating comparison results corresponding to a first portion of the digital code.

16. The method as claimed in claim 15, wherein the fine conversion comprises maintaining the first input signal constant, and configuring fine controlling, the SAR to control switches in the DAC such that the comparator successively compares the second input signal against the constant first input signal for generating comparison results corresponding to a remaining second portion of the digital output code.

17. A method of converting a plurality of analog input signals to a digital output signal, the method comprising the steps of:
providing a plurality of input channels;
receiving the respective analog input signal at a sample-and-hold (S/H) circuit to perform coarse conversion;
performing a fine conversion for each input channel at a digital-to-analog converter (DAC);
comparing, at a comparator, a first input signal received from the S/H circuit of the respective input channel with a second input signal received from the DAC for generating a comparison result at each conversion cycle of the comparator;

multiplexing, using a digital multiplexer (MUX), the comparison results received from the respective comparators; and generating, at a successive approximation register (SAR) common to all input channels, a digital output signal based on the multiplexed signal, wherein the S/H circuit and the DAC each comprises a capacitor array.

18. The method as claimed in claim 17, comprising simultaneously sampling, using the S/H circuits, two or more of the respective analog input signals.

19. The method as claimed in claim 17, comprising sampling, using the S/H circuits, the respective analog input signals sequentially.

20. The method as claimed in claim 19, wherein the step of receiving the respective analog input signal comprises receiving the analog input signals of the respective input channels independent of each other such that a maximum sampling time of each S/H circuit is determined based on the equation:

$$t_{s2} = [1 + (m-1) \cdot (n+1)] \cdot T_{clk} \approx (m-1) \cdot \frac{1}{2 \cdot m \cdot f_{signal}}$$

where $t_{s2}$ is the maximum sampling time, m is the number of input channels, n is the resolution level of the ADC, $T_{clk}$ is the duration of one clock cycle, and $f_{signal}$ is the input signal bandwidth.

* * * * *